(12) United States Patent
Takishita et al.

(10) Patent No.: US 11,081,410 B2
(45) Date of Patent: Aug. 3, 2021

(54) METHOD OF MANUFACTURING SEMICONDUCTOR DEVICE

(71) Applicant: FUJI ELECTRIC CO., LTD., Kawasaki (JP)

(72) Inventors: Hiroshi Takishita, Matsumoto (JP); Kazuhiro Kitahara, Matsumoto (JP); Ryouichi Kawano, Matsumoto (JP); Motoyoshi Kubouchi, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 16/552,344

(22) Filed: Aug. 27, 2019

(65) Prior Publication Data
US 2020/0135593 A1 Apr. 30, 2020

(30) Foreign Application Priority Data
Oct. 30, 2018 (JP) .............................. JP2018-204541

(51) Int. Cl.
*H01L 21/66* (2006.01)
*H01L 29/66* (2006.01)
(Continued)

(52) U.S. Cl.
CPC ............ *H01L 22/30* (2013.01); *H01L 21/265* (2013.01); *H01L 29/0623* (2013.01);
(Continued)

(58) Field of Classification Search
CPC .................. H01L 22/30; H01L 29/6609; H01L 29/66348; H01L 21/265; H01L 29/66136;
(Continued)

(56) References Cited

U.S. PATENT DOCUMENTS 6,624,078 B1 * 9/2003 Ravkin .................. H01L 22/34
 134/1.3
6,939,726 B2 * 9/2005 Hsu ........................ H01L 22/20
 257/E21.525

(Continued)

FOREIGN PATENT DOCUMENTS

JP  2000-114334 A  4/2000
JP  2008-171891 A  7/2008
(Continued)

OTHER PUBLICATIONS

Machine translated document (Year: 2009).*

*Primary Examiner* — Ahmed N Sefer

(74) *Attorney, Agent, or Firm* — Rabin & Berdo, P.C.

(57) ABSTRACT

A method of manufacturing a semiconductor device from a semiconductor wafer in which a plurality of semiconductor chips are formed. The method includes a first process of forming an active region on a first main surface side of the semiconductor wafer and a second process of forming a first process control monitor (PCM) on a second main surface side of the semiconductor wafer. The method further includes before the second process, a third process of forming a second PCM on the first main surface side of the semiconductor wafer. The first PCM and the second PCM are formed at an area located at the same position in a plan view of the semiconductor wafer.

10 Claims, 12 Drawing Sheets

(51) Int. Cl.

| | |
|---|---|
| *H01L 21/265* | (2006.01) |
| *H01L 29/861* | (2006.01) |
| *H01L 29/739* | (2006.01) |
| *H01L 29/06* | (2006.01) |
| *H01L 27/07* | (2006.01) |
| *H01L 29/40* | (2006.01) |

(52) U.S. Cl.
CPC .... *H01L 29/6609* (2013.01); *H01L 29/66136* (2013.01); *H01L 29/66348* (2013.01); *H01L 29/7397* (2013.01); *H01L 29/8613* (2013.01); *H01L 22/34* (2013.01); *H01L 27/0727* (2013.01); *H01L 29/407* (2013.01)

(58) Field of Classification Search
CPC ............... H01L 29/407; H01L 29/8613; H01L 29/7397; H01L 29/0623; H01L 22/34; H01L 27/0727
See application file for complete search history.

(56) References Cited

U.S. PATENT DOCUMENTS

| | | |
|---|---|---|
| 2005/0032253 A1* | 2/2005 | Hsu ................... H01L 22/20 438/17 |
| 2009/0267200 A1 | 10/2009 | Gutt et al. |
| 2011/0316071 A1 | 12/2011 | Hatori |
| 2014/0061672 A1 | 3/2014 | Wakimoto et al. |
| 2014/0315352 A1 | 10/2014 | Shiigi |
| 2015/0364613 A1 | 12/2015 | Onozawa et al. |
| 2018/0138299 A1 | 5/2018 | Naito |
| 2018/0197977 A1 | 7/2018 | Kouno |
| 2018/0366346 A1 | 12/2018 | Mori et al. |
| 2019/0214408 A1* | 7/2019 | Mori ...................... G01R 31/28 |

FOREIGN PATENT DOCUMENTS

| | | | |
|---|---|---|---|
| JP | 2009218343 A | * | 9/2009 |
| JP | 5361808 B2 | | 12/2013 |
| JP | 2014-212154 A | | 11/2014 |
| JP | 6028852 B2 | | 11/2016 |
| JP | 2017-045949 A | | 3/2017 |
| WO | WO 2012/124191 A1 | | 9/2012 |
| WO | WO 2014/156849 A1 | | 10/2014 |
| WO | WO 2017/099122 A1 | | 6/2017 |

\* cited by examiner

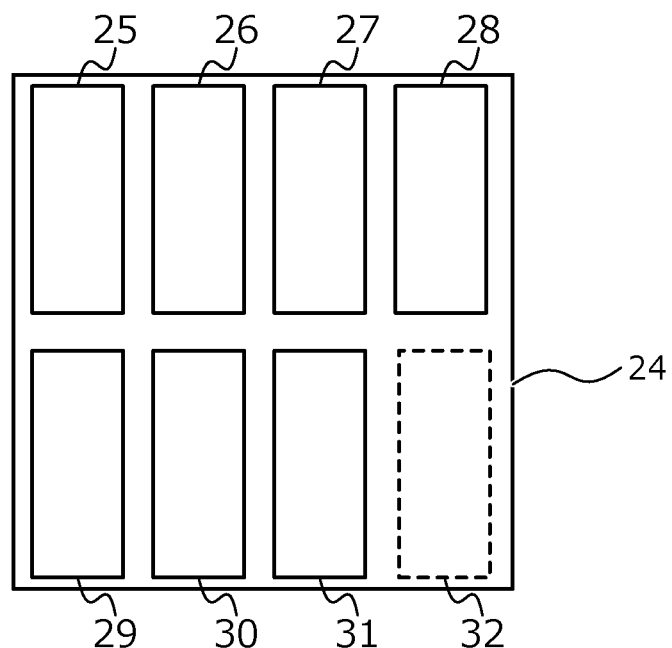

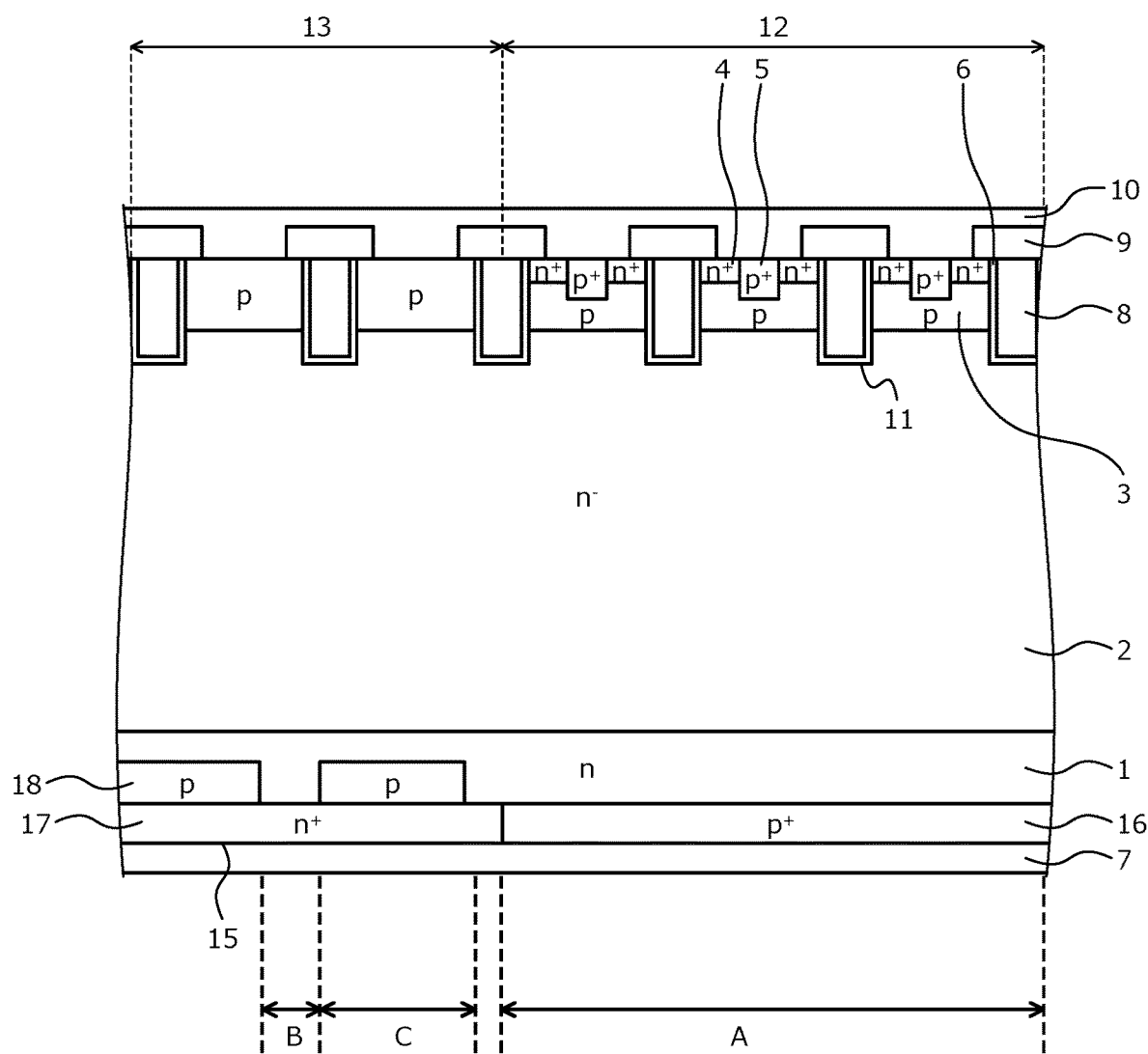

METHOD OF MANUFACTURING SEMICONDUCTOR DEVICE

CROSS REFERENCE TO RELATED APPLICATIONS

This application is based upon and claims the benefit of priority of the prior Japanese Patent Application No. 2018-204541, filed on Oct. 30, 2018, the entire contents of which are incorporated herein by reference.

BACKGROUND OF THE INVENTION

1. Field of the Invention

Embodiments of the invention relate to a method of manufacturing a semiconductor device.

2. Description of the Related Art

A technique of forming a process control monitor (PCM) on a wafer in which a device is formed is conventionally known for carrying out control, confirmation, inspections, or the like at each process of a method of manufacturing a device (for example, refer to Japanese Patent Application Laid-Open Publication No. 2000-114334). For example, sheet resistance for confirming an ion implantation amount and drive conditions, and capacitance voltage characteristics (CV) for confirming film thickness of an oxide film, etc. can be measured by evaluating or analyzing the PCM In this manner, an abnormal state of equipment used in a process of the method of manufacturing the device can be detected by the PCM. Further, at each process, management of whether differences (variation) within a wafer, between wafers, between lots, between devices, etc. are within a design range of the actual device is possible. Here, when a defect occurs in the actual device, the actual device itself is evaluated or analyzed, whereby a cause of the defect can be checked to a certain extent. Nonetheless, when variation at processes overlaps, a principal cause of the defect is difficult to identify. On the other hand, when the PCM is evaluated or analyzed, the PCM can be created at each process and therefore, has an effect of facilitating identification of a principle cause of the defect.

FIG. 12 is a plan view of a front surface of a semiconductor wafer in a method of manufacturing a conventional semiconductor device. As depicted in FIG. 12, a method of providing at plural sites at a front surface of a semiconductor wafer 121, a PCM for identifying to which layer foreign particles or dust belong has been proposed. Further, FIG. 13 is a plan view of a rear surface of the semiconductor wafer in the method of manufacturing the conventional semiconductor device. As depicted in FIG. 13, in the conventional method, a PCM 123 is provided only at the front surface of the semiconductor wafer 121 and is not provided at the rear surface of the semiconductor wafer 121.

In the technique described in Japanese Patent Application Laid-Open Publication No. 2000-114334, a chip is formed that is provided with regions (hereinafter, PCM formation regions) for forming the PCM only at the front surface of the semiconductor wafer 121. Further, when a device is formed, at each process, a film formed in a region (hereinafter, semiconductor chip formation region) for forming the device is further formed in the PCM formation regions. In a subsequent process, when etching is performed in the semiconductor chip formation region, etching is not performed in the PCM formation regions, leaving the formed predetermined film. In this manner, a semiconductor chip 122 is formed in the semiconductor chip formation region, and the PCM 123 is formed in the PCM formation regions. Further, the remaining PCM 123 of the film is analyzed, thereby enabling identification of the layer to which a substance (foreign particles or dust) belongs that caused a defect in electrical characteristics of the device.

Here, for example, an insulated gate bipolar transistor (IGBT) may be the device formed on the semiconductor wafer 121. The IGBT performs as a switch, sustaining voltage and completely interrupting current when OFF, while flowing current with a smallest possible voltage drop, i.e., a smallest possible ON resistance when ON.

Further, to facilitate size reductions of power converting equipment overall (related chips including an IGBT), development is also advancing for reverse conducting-IGBTs (RC-IGBTs) having a structure in which the IGBT and a free wheeling diode (FWD) connected in antiparallel to the IGBT are built into and integrated on a single semiconductor chip.

SUMMARY OF THE INVENTION

According to an embodiment of the invention, a method of manufacturing a semiconductor device from a semiconductor wafer in which a plurality of semiconductor chips are formed, includes: laying out a plurality of chip areas for the semiconductor chips in the semiconductor wafer, the semiconductor wafer having a first main surface and a second main surface opposite to the first main surface; forming a plurality of active regions in the plurality of chip areas, respectively; and forming at the second main surface a first process control monitor (PCM) in a first area other than the chip areas in which the active regions are formed.

In the embodiment, the method further includes before forming the first PCM, forming at the first main surface of the semiconductor wafer a second PCM in a second area other than the chip areas in which the active regions are formed. The first area and the second area entirely overlap each other in a plan view of the semiconductor wafer.

In the embodiment, the method further includes concurrently performing an ion implantation by implanting ions at the first area to form the first PCM and at each of the chip areas of the second main surface of the semiconductor wafer to form a corresponding one of the active regions.

In the embodiment, forming a plurality of active regions includes performing a plurality of ion implantations in the plurality of active regions at the second main surface, and only one of the plurality of ion implantations performed in the active regions at the second main surface is concurrently performed at the first area to form the evaluation portion.

In the embodiment, forming the plurality of active regions includes performing a plurality of ion implantations in the plurality of active regions at the second main surface, and a combination of more than one ion implantation among the plurality of ion implantations performed in the active regions at the second main surface is concurrently performed at the first area to form the evaluation portion.

In the embodiment, forming the first PCM includes forming a marker at the first area for identifying a position of the first PCM relative to an entire area of the second main surface of the semiconductor wafer.

In the embodiment, the first PCM includes a plurality of marker portions, and forming the first PCM includes forming a first marker portion disposed, as viewed in a plan view of the semiconductor wafer, at a center position of the second main surface of the semiconductor wafer, and a second marker portion disposed, as viewed in a plan view of the semiconductor wafer, at a peripheral position of the second main surface of the semiconductor wafer.

In the embodiment, forming a plurality of active regions includes forming a first load electrode on the first main surface, and a second load electrode on the second main surface so that a current passes between the first load electrode and the second load electrode.

In the embodiment, forming a plurality of active regions includes forming at the first main surface a control electrode that controls the current passing between the first load electrode and the second load electrode.

According to another example of the invention, a method of manufacturing a semiconductor device from a semiconductor wafer in which a plurality of semiconductor chips are formed, includes: laying out a plurality of chip areas for the semiconductor chips in the semiconductor wafer, the semiconductor wafer having a first main surface and a second main surface opposite to the first main surface; performing at the first main surface of the semiconductor wafer, a plurality of forming steps for forming the active regions in the chip areas; forming at the first main surface of the semiconductor wafer, a process control monitor (PCM) in a second area other than the chip areas in which the active regions are to be formed; performing at the second main surface of the semiconductor wafer, a plurality of forming steps for forming the active regions in the chip areas; and forming at the second main surface an other PCM in a first area other than the chip areas in which the active regions are formed.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 2B is a plan view of a rear-surface PCM in the method of manufacturing the semiconductor device according to the first embodiment.

FIG. 3 is a cross-sectional view of a semiconductor-chip active portion.

DETAILED DESCRIPTION OF THE INVENTION

Figure 1:
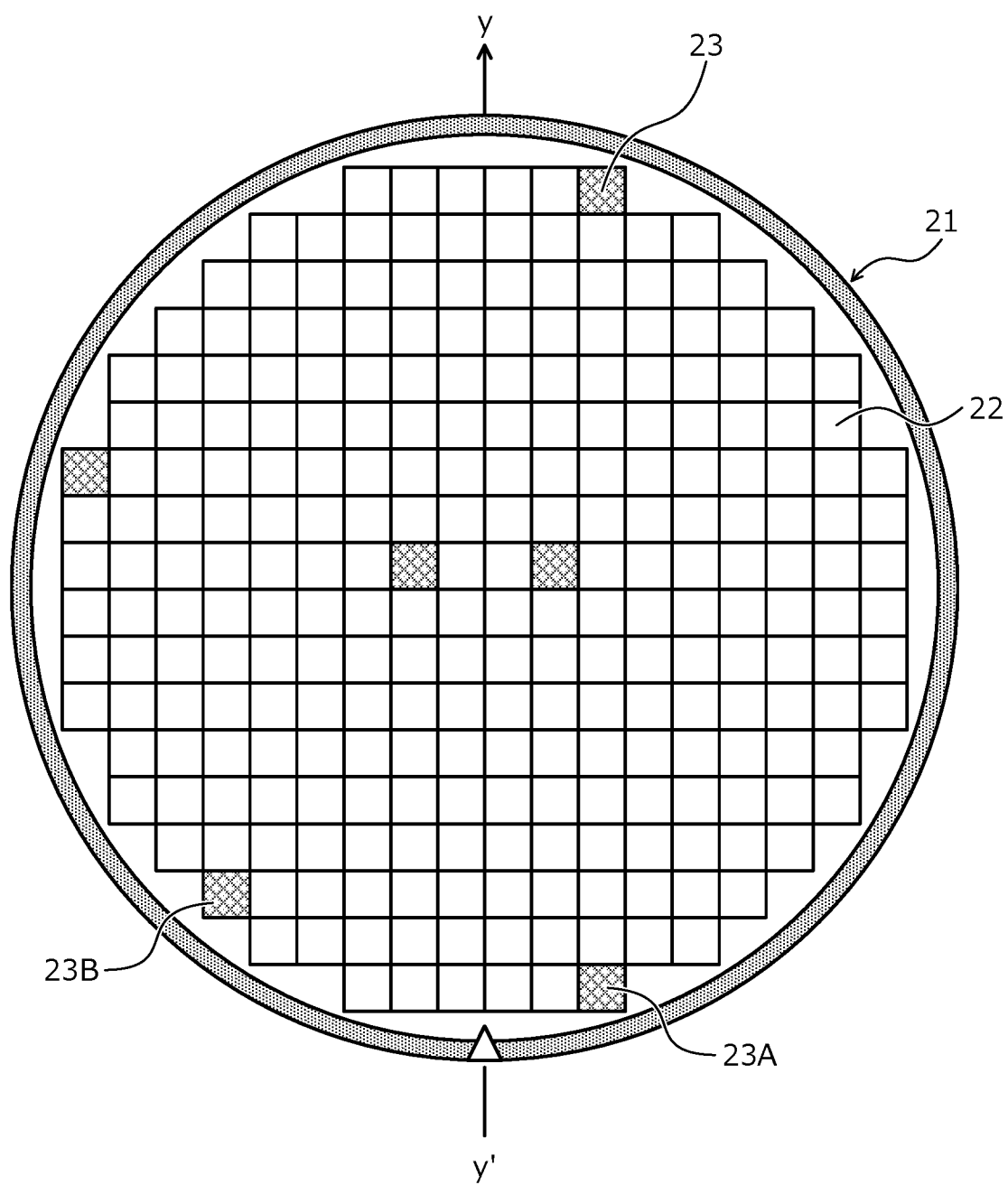
FIG. 1 is a plan view of a front surface of a semiconductor wafer in a method of manufacturing a semiconductor device according to an embodiment.

First, problems associated with the conventional techniques will be discussed. In the conventional method, the PCM 123 is formed at the front surface of the semiconductor wafer 121, thereby enabling analysis of a manufacturing process (hereinafter, front-surface process) for a semiconductor region formed from the front surface of the semiconductor wafer 121. However, in some instances, analysis of a manufacturing process (hereinafter, rear-surface process) for a semiconductor region formed from the rear surface of the semiconductor wafer 121 is impossible. For example, in a RC-IGBT, both an IGBT and a FWD are provided and therefore, at the rear surface, various impurity layers such as a collector region of the IGBT and a cathode region of the FWD are selectively formed having a small mathematical area. When there are small regions such as these, there may be cases where the identification of a process where foreign particles or dust contaminated the semiconductor wafer 121 during a rear-surface process is impossible, and the identification of a principle cause of a defect is impossible.

Embodiments of a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −, and represents one example. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described.

Figure 2A:
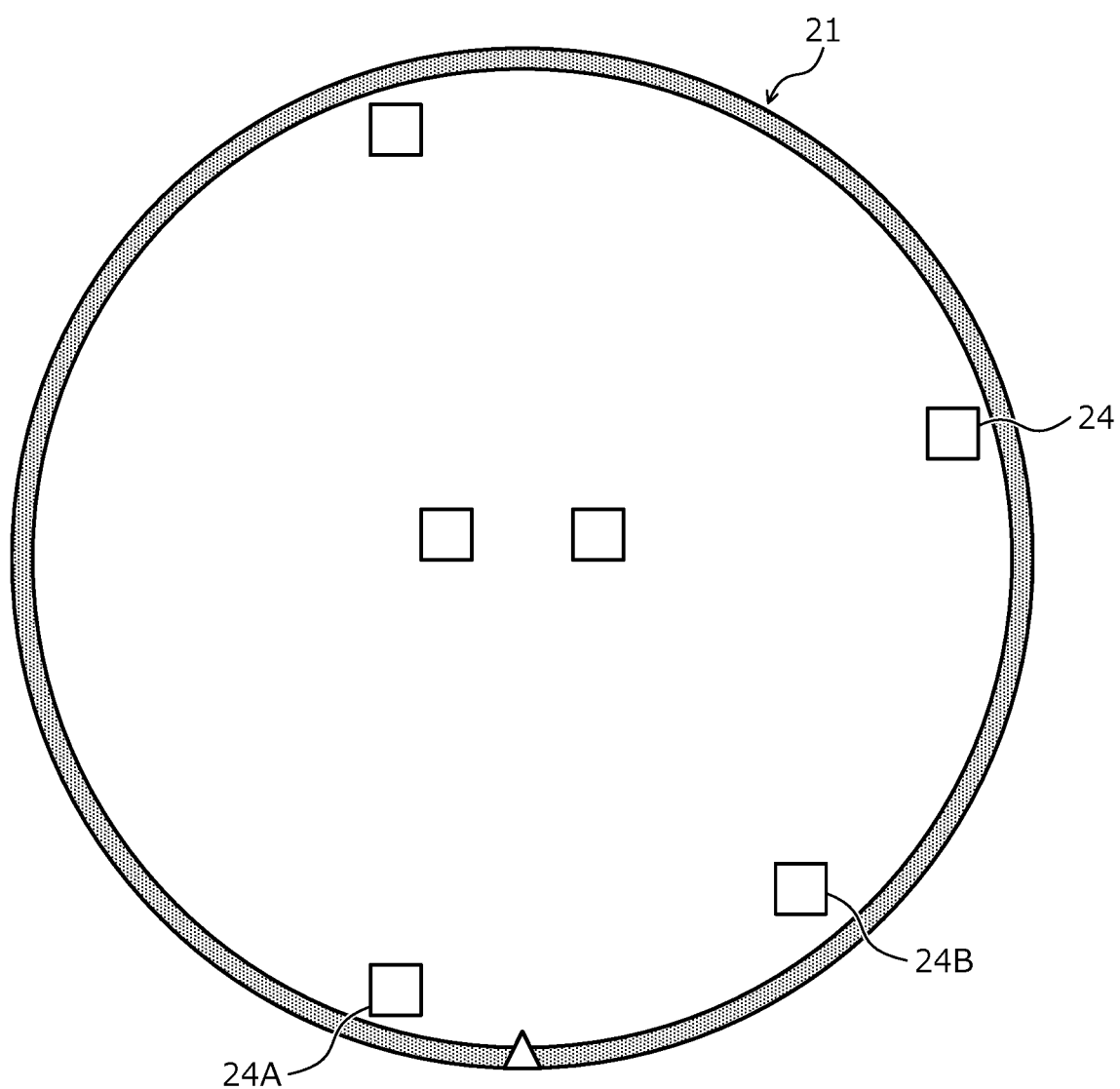
FIG. 2A is a plan view of a rear surface of the semiconductor wafer in a method of manufacturing a semiconductor device according to a first embodiment.

FIG. 1 is a plan view of a front surface of a semiconductor wafer in a method of manufacturing a semiconductor device according to an embodiment. FIG. 2A is a plan view of a rear surface of the semiconductor wafer in a method of manufacturing a semiconductor device according to a first embodiment. FIG. 2B is a plan view of a rear-surface PCM in the method of manufacturing the semiconductor device according to the first embodiment.

As depicted in FIG. 1, a semiconductor wafer 21 has a front surface (first main surface) that is divided into many regions, a majority of which are set as a semiconductor chip formation region for forming a semiconductor chip 22 while PCM formation regions each for forming a PCM 23 are also provided. In the semiconductor chip 22, an active region is formed. As depicted in FIG. 2A, rear-surface PCM formation regions each for forming a rear-surface PCM 24 are further provided at a rear surface (second main surface) of the semiconductor wafer 21. In this manner, in the present embodiment, the rear-surface PCM 24 is provided at the rear surface as well, and by analyzing the rear-surface PCM 24, it becomes possible to analyze a manufacturing process of a structure formed concurrently with a semiconductor chip formation region on the rear surface side.

The semiconductor wafer 21 depicted in FIG. 2A is a view of the semiconductor wafer 21 depicted in FIG. 1 after the semiconductor wafer 21 has been rotated 180 degrees around a y-y' axis depicted in FIG. 1. Thus, a rear side of the PCM 23A depicted in FIG. 1 is the rear-surface PCM 24A depicted in FIG. 2A and a rear side of the PCM 23B depicted in FIG. 1 is the rear-surface PCM 24B depicted in FIG. 2A. In this manner, the PCM 23 and the rear-surface PCM 24 may be provided respectively on a front surface side and a rear surface side of the semiconductor wafer 21, at a same position in the semiconductor wafer 21. With such configuration, there are fewer regions where no commercial product (the semiconductor chip 22) is formed.

Here, the PCM 23 and the rear-surface PCM 24 may be smaller than the semiconductor chip 22 to prevent the semiconductor chip 22 from being affected by the PCM 23 and the rear-surface PCM 24. Alternatively, the PCM 23, the rear-surface PCM 24, and the semiconductor chip 22 may be of a same size, and the PCM 23 and the rear-surface PCM 24 may be formed within a range so as to be smaller than the PCM formation region and rear-surface PCM formation region. Further, when the PCM 23 or the rear-surface PCM 24 does not fit in a region equivalent to one semiconductor chip, the PCM 23 or the rear-surface PCM 24 may be formed in two or more regions for the semiconductor chips.

Further, the semiconductor chip 22 formed in a semiconductor chip formation region of the semiconductor wafer 21, in the present example, is a RC-IGBT that includes a floating p-type region 18 (refer to FIG. 3) at an n$^+$-type cathode region 17. FIG. 3 is a cross-sectional view of a semiconductor-chip active portion. A p$^+$-type collector region 16, the n$^+$-type cathode region 17, an n-type FS region 1, the floating p-type region 18 are provided on the rear surface side. Since the floating p-type region 18 is present, during conduction of the FWD, electron injection is suppressed, and reverse recovery characteristics are enhanced. The floating p-type region 18 is formed so as to selectively cover the n$^+$-type cathode region 17.

The p$^+$-type collector region 16, the n$^+$-type cathode region 17, the n-type FS region 1, and the floating p-type region 18 are formed by selectively performing ion implantation from the rear surface side and sandwich an n$^-$-type drift layer 2 with a metal-oxide-semiconductor (MOS) gate structure of the IGBT and an anode region of the FWD selectively provided on the front surface side. Further, in the semiconductor chip 22, a lifetime adjustment region may be provided in the n$^-$-type drift layer 2, at a site near the front surface side. The lifetime adjustment region is provided by generating defects in semiconductor crystals by irradiating a particle beam such as protons or helium nuclei from the rear surface side. When the lifetime adjustment region is selectively formed, a hardmask containing a metal such as aluminum (Al) may be used instead of a photoresist mask. The lifetime adjustment region may be provided in a FWD region 13 and a portion of an IGBT region 12.

As depicted in FIG. 2B, in the rear-surface PCM 24, a collector region evaluation portion 25 where ion implantation for forming a p$^+$-type collector region of the IGBT is performed, a cathode region evaluation portion 26 where ion implantation for forming an n$^+$-type cathode region of the diode is performed, a floating p-type region evaluation portion 27 where ion implantation for forming a floating p-type region is performed, and an FS region evaluation portion 28 where ion implantation for forming an n-type FS region is performed may be provided. Here, for example, the ion implantation for forming the p$^+$-type collector region is performed concurrently in the collector region evaluation portion 25 and in the semiconductor chip formation regions. Further, a mask or the like is used, whereby other ion implantation is not performed. The cathode region evaluation portion 26, the floating p-type region evaluation portion 27, and the FS region evaluation portion 28 are similarly formed. As a result, analysis of manufacturing processes of each layer of the rear surface side of the semiconductor device becomes possible.

Further, in the rear-surface PCM 24, an evaluation portion having a layer structure similar to a rear surface structure of the semiconductor chip 22 is provided. For example, an IGBT rear-surface structure evaluation portion 29 where ion implantation for forming the FS region and the collector region corresponding to a region A depicted in FIG. 3 is performed, a diode rear-surface-structure first evaluation portion 30 where ion implantation for forming the FS region and the cathode region corresponding to a region B depicted in FIG. 3 is performed, a diode rear-surface-structure second evaluation portion 31 where ion implantation for forming the FS region, the floating p-type region, and the cathode region corresponding to a region C depicted in FIG. 3 is performed are provided. In the IGBT rear-surface structure evaluation portion 29, ion implantation other than for forming the FS region and the collector region is not performed by using a mask or the like. The diode rear-surface-structure first evaluation portion 30 and the diode rear-surface-structure second evaluation portion 31 are similarly formed. The IGBT rear-surface structure evaluation portion 29, the diode rear-surface-structure first evaluation portion 30, and the diode rear-surface-structure second evaluation portion 31 are a collection of evaluation regions for ion implantations corresponding to the rear surface structure and are analyzed, thereby facilitating analysis of the quality of each portion of the rear surface side of the semiconductor chip 22. Further, as a background evaluation portion 32, a region in which no ion implantation is performed may be formed. Analysis of the background evaluation portion 32 enables evaluation minus effects of the substrate. As the background evaluation portion 32, providing a proper mathematical area enables more accurate evaluation of the effects of the substrate. In some cases, the background evaluation portion 32 may be indistinguishable from a surrounding area. In the rear-surface PCM 24, a region where none of the evaluation portions 25 to 32 is formed is a region where no ion implantation is performed; or may be, for example, a region where the ion implantation for forming the p$^+$-type collector region is performed uniformly.

Mathematical areas of the collector region evaluation portion 25, the cathode region evaluation portion 26, the floating p-type region evaluation portion 27, the FS region evaluation portion 28, the IGBT rear-surface structure evaluation portion 29, the diode rear-surface-structure first evaluation portion 30, and the diode rear-surface-structure second evaluation portion 31 may be substantially equal and large enough to enable analysis of the manufacturing processes.

Here, for example, when a sufficient mathematical area of the p$^+$-type collector region 16 is large, an evaluation region for the collector region may be omitted. In this case, a manufacturing process may be analyzed by the p$^+$-type collector region 16 of the semiconductor chip 22 formed in a semiconductor chip formation region and not in the rear-surface PCM 24 by the collector region evaluation portion 25.

Further, the PCM 23 and the rear-surface PCM 24 may be formed in a dummy chip outside an effective area of the semiconductor chips 22 of the semiconductor wafer 21. In this case, the PCM 23 and the rear-surface PCM 24 may be provided in greater number. Further, to measure variation within a surface, the PCM 23 and the rear-surface PCM 24 may be provided evenly at a center portion, an intermediate portion, and an end portion of the semiconductor wafer 21. Further, the PCM 23 and the rear-surface PCM 24 may be provided with markers indicating a position. For example, a marker indicating the center portion, a marker indicating the intermediate portion, and a marker indicating the end portion are provided. As a result, when the semiconductor chips are separated, positions on the semiconductor wafer 21 having the PCM 23 and the rear-surface PCM 24 are recognizable. These markers, for example, may be formed by a mask used at the time of ion implantation.

Figure 7:
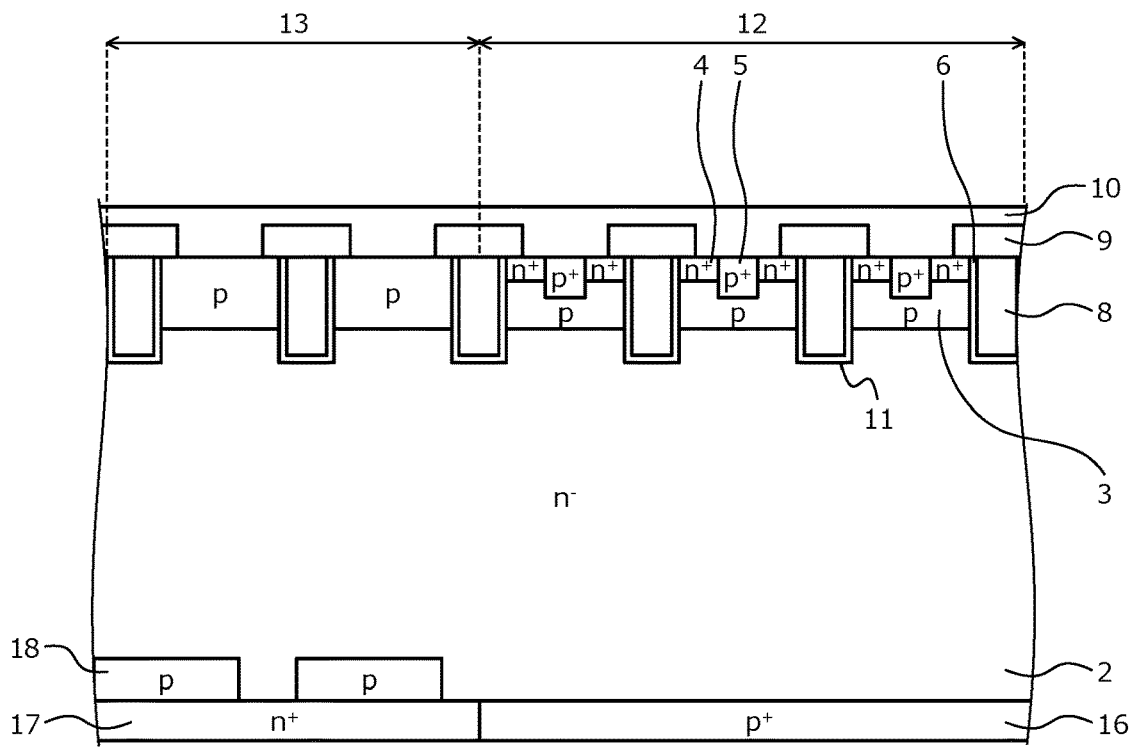
FIG. 7 is a cross-sectional view related to the method of manufacturing the semiconductor device according to the first embodiment.
Figure 8:
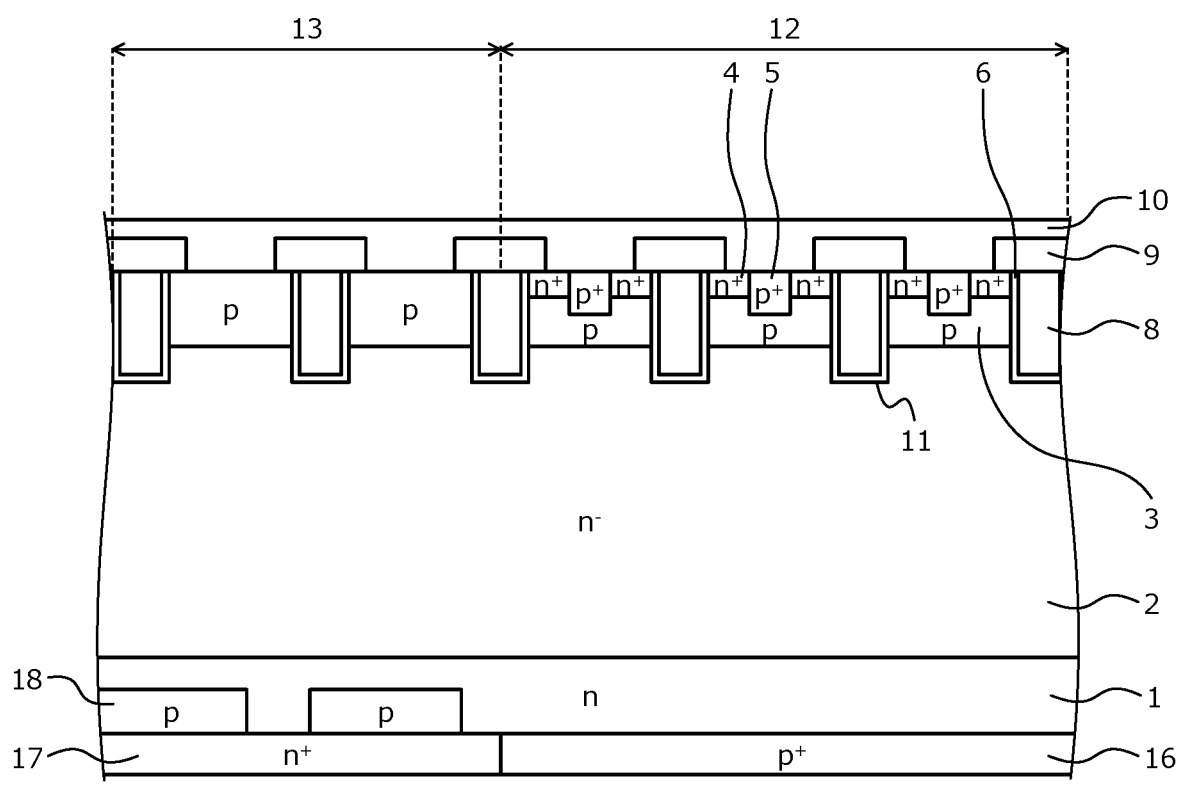
FIG. 8 is a cross-sectional view related to the method of manufacturing the semiconductor device according to the first embodiment.
Figure 9:
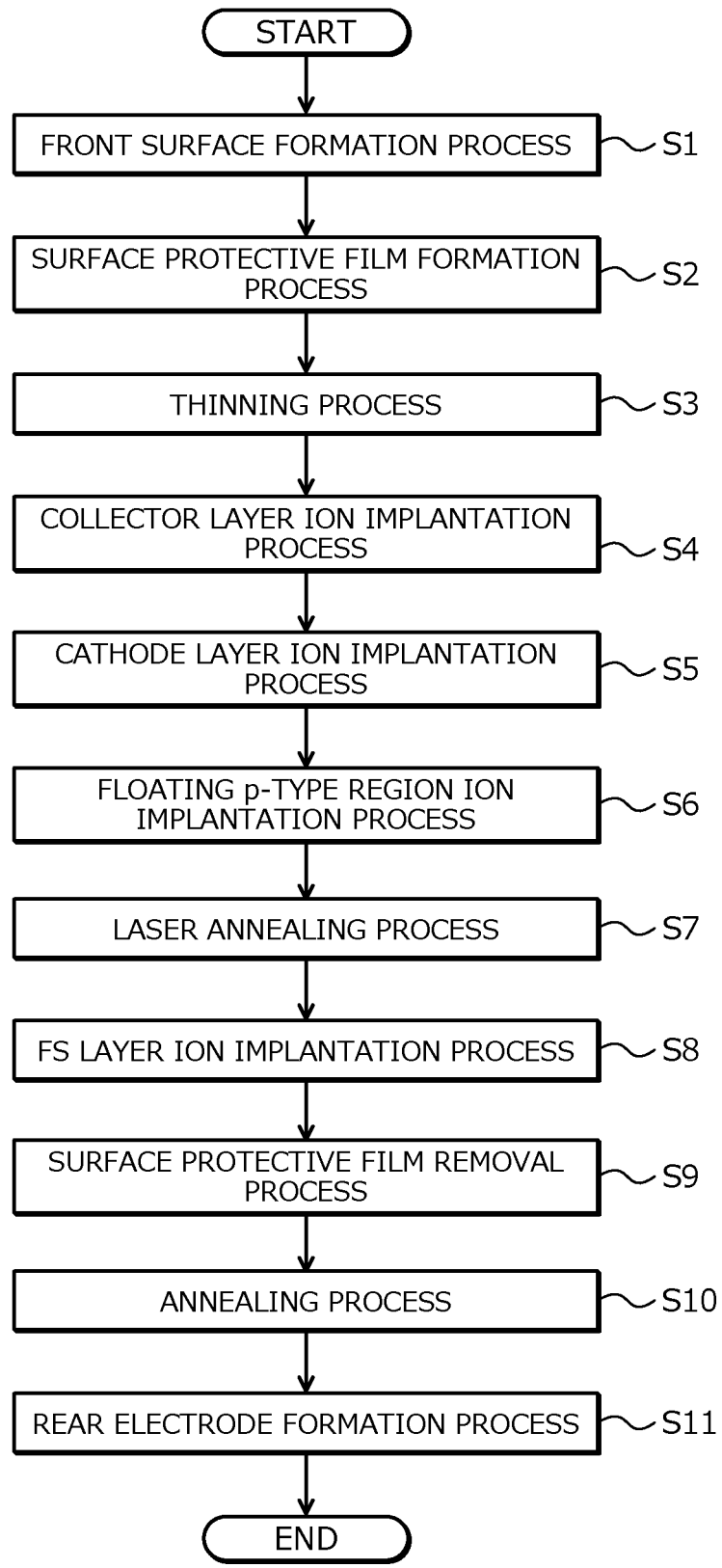
FIG. 9 is a flowchart of a method of forming a rear surface structure according to the method of manufacturing the semiconductor device according to the first embodiment.

Formation of the semiconductor chip 22, the PCM 23, and the rear-surface PCM 24 in the semiconductor wafer 21 is carried out as follows. A method of manufacturing the semiconductor device according to an embodiment hereinafter will be described taking the RC-IGBT as an example. FIGS. 4, 5, 6, 7, and 8 are cross-sectional views related to the method of manufacturing the semiconductor device according to the first embodiment. FIG. 9 is a flowchart of a method of forming a rear surface structure according to the method of manufacturing the semiconductor device according to the first embodiment.

The RC-IGBT, for example, is constituted by an IGBT of a trench gate structure and a FWD connected in antiparallel to the IGBT and integrated with the IGBT on a single semiconductor substrate (semiconductor chip). In particular, on the single semiconductor substrate, the IGBT region 12 constituting an operating region of the IGBT and the FWD region 13 constituting an operating region of the FWD are provided in parallel in the active region (refer to FIG. 3). The active region is a region in which current flows in an ON state. In an edge termination region (not depicted) that surrounds a periphery of the active region, an edge termination structure such as a guard ring or field plate may be provided.

First, an element structure is formed at a front surface of the semiconductor device (step S1: first process, third process). As depicted in FIG. 2A, the semiconductor wafer 21 of an n$^-$-type and constituting the n$^-$-type drift layer 2 is prepared. A material of the semiconductor wafer 21 may be silicon (Si), or a wide bandgap semiconductor such as silicon carbide (SiC) or gallium nitride (GaN). Hereinafter, description will be given taking, as an example, a case in which the semiconductor wafer 21 is a silicon wafer.

Here, a front-surface element structure is formed. First, a process including photolithography and ion implantation as one set is repeatedly performed under different conditions, thereby forming on the front surface side of the semiconductor wafer 21, a p-type base region 3, an n$^+$-type emitter region 4, and a p$^+$-type contact region 5 of the IGBT. The p-type base region 3 is formed in the active region overall and spans surfaces of the IGBT region 12 and the FWD region 13 overall. The p-type base region 3 acts as a p-type anode region in the FWD region 13. In the IGBT region 12, the n$^+$-type emitter region 4 and the p$^+$-type contact region 5 are selectively formed in the p-type base region 3.

A portion of the semiconductor wafer 21 other than the p-type base region 3, the n-type field stop (FS) region 1 described hereinafter, the p$^+$-type collector region 16, and the n$^+$-type cathode region 17 constitutes the n$^-$-type drift layer 2. In the IGBT region 12, an n-type accumulation layer (not depicted) may be formed between the n$^-$-type drift layer 2 and the p-type base region 3. The n-type accumulation layer has a function of a barrier against minority carriers (holes) of the n$^-$-type drift layer 2 when the IGBT turns ON and a function of accumulating minority carriers in the n$^-$-type drift layer 2.

Next, the front surface of the semiconductor wafer 21 is thermally oxidized, and in the edge termination region, a field oxide film is formed covering the front surface of the semiconductor wafer 21. Next, in the IGBT region 12, a trench 11 is formed by photolithography and etching. The trench 11 penetrates the n$^+$-type emitter region 4 and the p$^+$-type contact region 5, and reaches the n$^-$-type drift layer 2. The trench 11 is disposed in a layout that when viewed from the front surface side of the semiconductor wafer 21, for example, has a striped shape extending along a direction (direction of view in FIG. 3) orthogonal to a direction (horizontal direction in FIG. 3) along which the IGBT region 12 and the FWD region 13 are arranged.

Further, the trench 11 is further formed in the FWD region 13 in the same layout as in the IGBT region 12. In the FWD region 13, the trench 11 penetrates the p-type base region 3 (p-type anode region) and reaches the n$^-$-type drift layer 2. Next, a gate insulating film 6 is formed along an inner wall of the trench 11 by thermal oxidation, for example. Next, on the front surface of the semiconductor wafer 21, a poly-silicon (poly-Si) layer is formed so as to be embedded in the trench 11. Next, for example, the poly-silicon layer is etched so as to leave a portion thereof in the trench 11 as a gate electrode 8 (control electrode).

A MOS gate having the trench gate structure is constituted by the p-type base region 3, the n$^+$-type emitter region 4, the p$^+$-type contact region 5, the trench 11, the gate insulating film 6, and the gate electrode 8. After formation of the gate electrode 8, the n$^+$-type emitter region 4 and the p$^+$-type contact region 5 may be formed. The n$^+$-type emitter region 4 suffices to be disposed in at least one mesa region between the trench 11 and an adjacent trench 11, and a mesa region may be present in which the n$^+$-type emitter region 4 is not disposed. Further, the n$^+$-type emitter region 4 may be selectively disposed at a predetermined interval along the direction in which the trench 11 extends in a striped shape.

Next, on the front surface of the semiconductor wafer 21, an interlayer insulating film 9 is formed so as to cover the gate electrode 8. Next, the interlayer insulating film 9 is patterned, thereby forming plural contact holes that penetrate the interlayer insulating film 9 in a depth direction. The depth direction is a direction from the front surface of the semiconductor wafer 21 toward a rear surface thereof. In the contact holes of the IGBT region 12, the n$^+$-type emitter regions 4 and the p$^+$-type contact regions 5 are exposed. In the contact holes of the FWD region 13, the p-type base region 3 is exposed.

Figure 4:
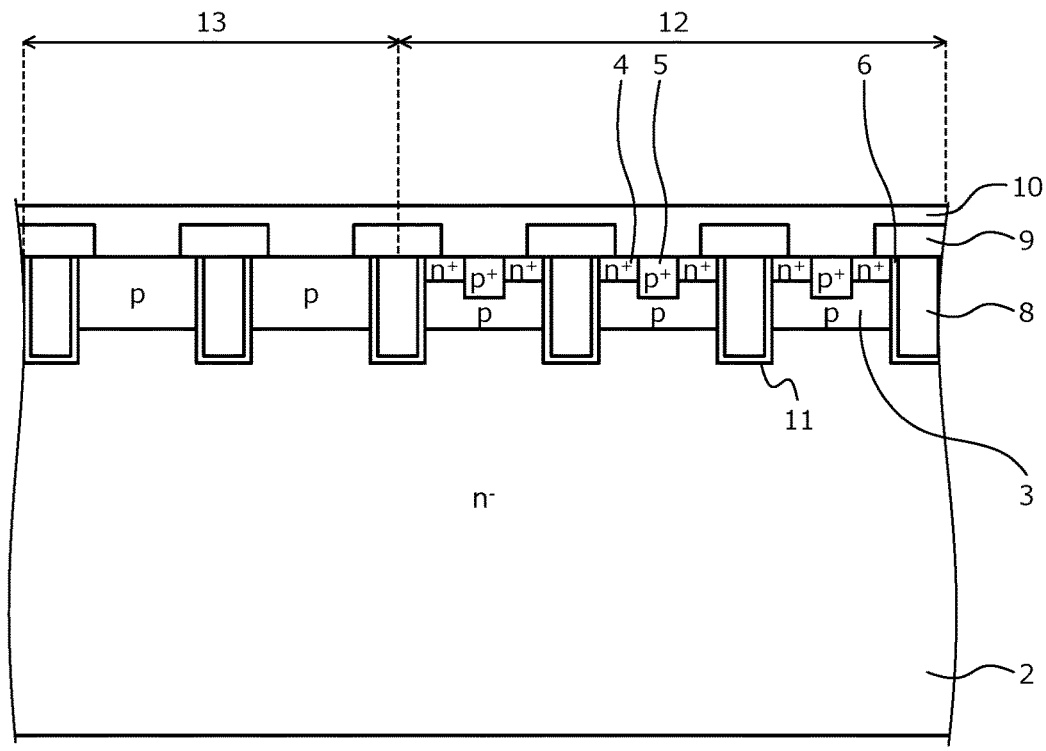
FIG. 4 is a cross-sectional view related to the method of manufacturing the semiconductor device according to the first embodiment.

Next, on the interlayer insulating film 9, a front electrode 10 (first load electrode) is formed so as to be embedded in the contact holes. A barrier metal film (not depicted) may be formed along an inner wall of the contact holes, and a tungsten plug (not depicted) embedded with a tungsten film may be formed. In the IGBT region 12, the front electrode 10 is electrically connected to the p-type base region 3, the n$^+$-type emitter region 4, and the p$^+$-type contact region 5, and functions as an emitter electrode. Further, in the FWD region 13, the front electrode 10 is electrically connected to the p-type base region 3 and functions as an anode electrode. In a mesa region in which the n$^+$-type emitter region 4 is not disposed, the front electrode 10 may be electrically connected to the p-type base region 3. Next, a passivation film (not depicted) of polyimide or the like is formed in the edge termination region, whereby the front-surface element structure is completed. Further, by a method similar to the technique described in Japanese Patent Application Laid-Open Publication No. 2000-114334, the PCM 23 is formed in the PCM formation regions. The state up to here is depicted in FIG. 4.

Next, a process of forming a protective film at the front surface is performed (step S2). The protective film (not depicted) that protects the front surface of the semiconductor device is formed on the front electrode 10, for example, using a resist, a tape, a glass, or the like. The points at which formation of the protective film and removal of the protective film are performed in the method may be changed. Next, a thinning process of grinding (back grinding) the semiconductor wafer 21 from the rear surface side, to a thickness for use as the semiconductor device is performed (step S3).

Figure 5:
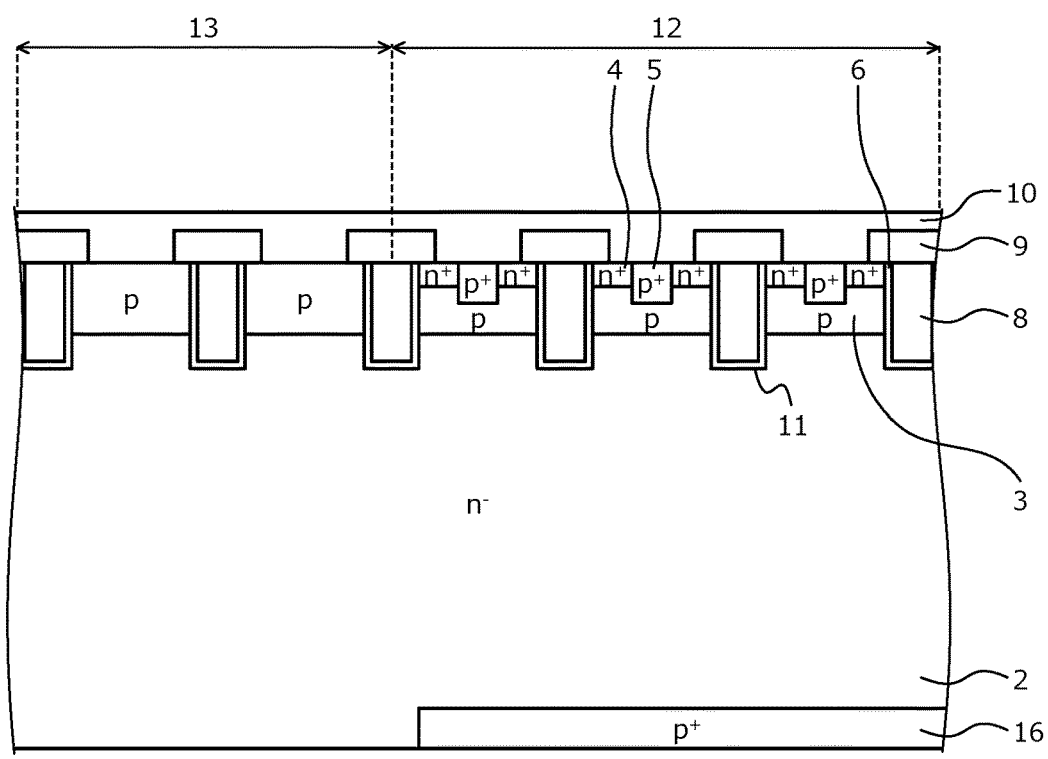
FIG. 5 is a cross-sectional view related to the method of manufacturing the semiconductor device according to the first embodiment.

Next, an ion implantation process of forming the $p^+$-type collector region 16 on the rear surface side of the semiconductor wafer 21 by photolithography and implantation of a p-type ion, for example, boron (B) is performed (step S4: second process). The state up to here is depicted in FIG. 5. Here, the IGBT rear-surface structure evaluation portion 29 that simulates a region where the $p^+$-type collector region 16 and the n-type FS region 1 overlap and the collector region evaluation portion 25 of the rear-surface PCM 24 are also concurrently ion implanted.

Figure 6:
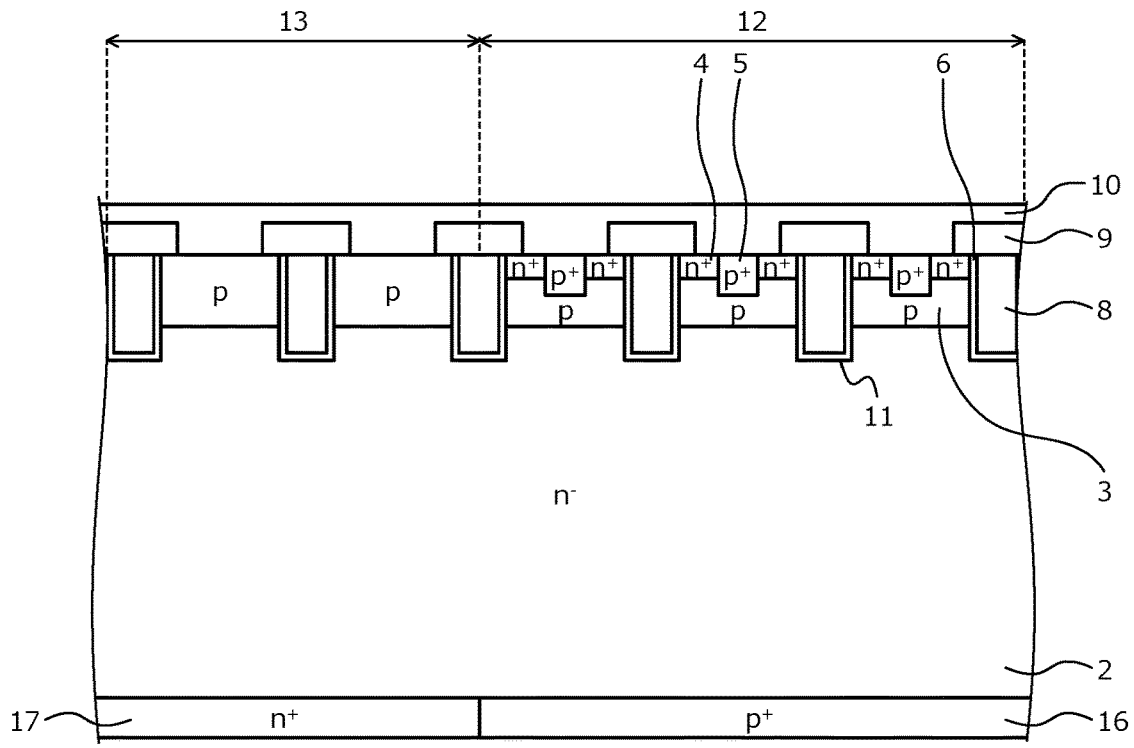
FIG. 6 is a cross-sectional view related to the method of manufacturing the semiconductor device according to the first embodiment.

Next, the $n^+$-type cathode region 17 is formed on the rear surface side of the semiconductor wafer 21 by photolithography and implantation of an n-type ion, for example, phosphorus (P) (step S5: second process). The state up to here is depicted in FIG. 6. Here, the diode rear-surface-structure first evaluation portion 30 that simulates a region where the $n^+$-type cathode region 17 and the n-type FS region 1 overlap, the diode rear-surface-structure second evaluation portion 31 that simulates a region where the $n^+$-type cathode region 17 and the floating p-type region 18 and the n-type FS region 1 overlap, and the cathode region evaluation portion 26 of the rear-surface PCM 24 are also concurrently ion implanted.

Next, an ion implantation process of forming the floating p-type region 18 on the rear surface side of the semiconductor wafer 21 by photolithography and implantation of a p-type ion, for example, boron (B) is performed (step S6: second process). The state up to here is depicted in FIG. 7. Here, the diode rear-surface-structure second evaluation portion 31 that simulates a region where the $n^+$-type cathode region 17, the floating p-type region 18 and the n-type FS region 1 overlap and the floating p-type region evaluation portion 27 of the rear-surface PCM 24 are also concurrent ion implanted.

In the foregoing, a mask is used to implant a p-type ion in the $p^+$-type collector region 16 and subsequently, a mask is used to implant an n-type ion in the $n^+$-type cathode region 17. However, the $p^+$-type collector region 16 and the $n^+$-type cathode region 17 may be formed by implanting a p-type ion in the surface of the wafer overall and thereafter, using a mask to implant an n-type ion in the $n^+$-type cathode region 17. In this case, the region corresponding to the rear-surface PCM 24 is concurrently formed by the same process.

Next, an annealing process of activating the ions implanted in the $p^+$-type collector region 16, the $n^+$-type cathode region 17, and the floating p-type region 18 is performed (step S7). For example, a vicinity nearest the rear surface is heated by a laser. Next, an ion implantation process for forming the n-type FS region 1 on the rear surface side of the semiconductor wafer 21 is performed by repeatedly performing under different conditions, a process that includes photolithography and ion implantation as one set (step S8). For example, hydrogen ions are implanted. Here, the FS region evaluation portion 28, the IGBT rear-surface structure evaluation portion 29, the diode rear-surface-structure first evaluation portion 30, and the diode rear-surface-structure second evaluation portion 31 of the rear-surface PCM 24 are also concurrently ion implanted.

Next, the protective film at the front surface is removed (step S9). A process of removing the protective film may be performed sooner or later in the method depending on processing conditions such as temperature. Next, an annealing process of activating the ions implanted in the n-type FS region 1 is performed (step S10). For example, the wafer overall is maintained at a temperature of about 400 degrees C. in a furnace. The state up to here is depicted in FIG. 8.

A lifetime adjusting layer may be formed in the $n^-$-type drift layer 2 by selectively irradiating a particle beam from a rear surface of the wafer to perform suitable annealing. For example, helium nuclei are irradiated to maintain a temperature of about 400 degrees C. A lifetime-adjusting-layer evaluation portion may also be formed in the rear-surface PCM.

Next, a rear electrode 7 (second load electrode) is formed on the rear surface of the semiconductor wafer 21 overall (step S11). The rear electrode 7 is in contact with the $p^+$-type collector region 16 and the $n^+$-type cathode region 17. The rear electrode 7 functions as a collector electrode and as a cathode electrode.

In this manner, the semiconductor wafer 21 is formed that includes the rear-surface PCM 24 and the PCM 23 that include evaluation portions for each of the layers of the semiconductor chip, and the semiconductor chips (RC-IGBT chips) having a predetermined integrated circuit. Further, evaluation and analysis of the layers becomes possible by the PCM 23 and the rear-surface PCM 24. For example, to analyze a structure of an ion implanted diffusion layer, sheet resistance of the PCM 23 and the rear-surface PCM 24 may be measured. Further, to evaluate an activation rate of a heat treatment after ion implantation, spreading resistance (SR) of the PCM 23 and the rear-surface PCM 24 may be measured. Further, to analyze carrier concentration in the depth direction, secondary ion mass spectrometry (SIMS) may be performed.

Thereafter, the semiconductor wafer 21 is cut (diced) into individual chips, whereby the RC-IGBT chips (semiconductor chips) are completed.

In this manner, each layer is analyzed, thereby eliminating any abnormalities that may occur subsequently in the method of manufacturing the semiconductor device to enhance the reliability of the semiconductor device while reducing defects in the semiconductor device and enhancing production yield. Further, analysis of each of the layers may be performed immediately following the process for forming the layer or may be performed after the semiconductor chip is completed. Immediately following the process for forming the layer means after performing the ion implantation and the annealing. In particular, analysis of the $p^+$-type collector region 16 and the $n^+$-type cathode region 17 may be performed after step S7. Analysis of the n-type FS region 1 may be performed after step S10. When analysis is performed immediately following the process for forming the layer, an effect is achieved in that defects are found quickly.

As described, according to the first embodiment, the rear-surface PCM 24 is formed at the rear surface of the semiconductor wafer 21. As a result, by analyzing the rear-surface PCM 24, it becomes possible to analyze a manufacturing process of a semiconductor region that is formed from the rear surface side of the semiconductor wafer. Further, the PCM is further formed at the front surface, and the rear-surface PCM 24 and the PCM 23 at the front surface may be respectively provided on the first main surface and the second main surface side, at the same position in the semiconductor wafer. With such configuration, there are fewer regions where no commercial product (semiconductor chip) is formed.

Further, when the semiconductor chip 22 formed in the semiconductor wafer 21 is an RC-IGBT, the rear-surface PCM 24 is provided with the collector region evaluation portion 25 for the $p^+$-type collector region 16 of the IGBT, the cathode region evaluation portion 26 for the $n^+$-type cathode region 17 of the FWD, the floating p-type region evaluation portion 27 for the floating p-type region 18, and the FS region evaluation portion 28 for the n-type FS region 1 as well as evaluation regions having an impurity layer structure similar to portions of the rear surface side, e.g., the IGBT rear-surface structure evaluation portion 29 where the $p^+$-type collector region 16 and the n-type FS region 1 are formed, the diode rear-surface-structure first evaluation portion 30 where the $n^+$-type cathode region 17 and the n-type FS region 1 are formed, and the diode rear-surface-structure second evaluation portion 31 where the $n^+$-type cathode region 17, the floating p-type region 18, and the n-type FS region 1 are formed. As a result, manufacturing processes of each rear surface region of the semiconductor chip 22 may be evaluated and analysis of the quality of each portion of the semiconductor chip 22 is facilitated.

Figure 10:
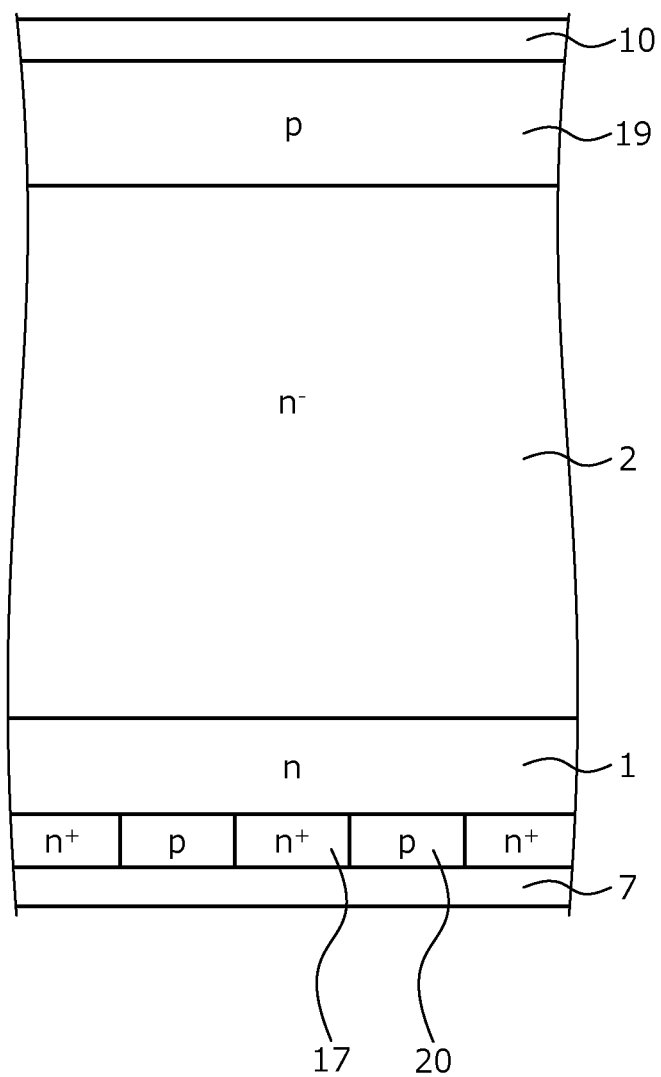
FIG. 10 is a cross-sectional view of the semiconductor device according to a second embodiment.

The semiconductor chip 22 in a second embodiment is a diode that includes on the rear surface side, the $n^+$-type cathode region 17 and a p-type dummy region 20. FIG. 10 is a cross-sectional view of the semiconductor device according to the second embodiment.

FIG. 10 is a cross-sectional view of semiconductor-chip active portion. On the front surface side, an anode region 19 is provided while on the rear surface side, the $n^+$-type cathode region 17, the n-type FS region 1, and the p-type dummy region 20 are provided. The p-type dummy region 20 and the $n^+$-type cathode region 17 are selectively provided on the rear surface side of the diode. Since the p-type dummy region 20 is present, during conduction, electron injection is suppressed, and reverse recovery characteristics are enhanced. The $n^+$-type cathode region 17 and the p-type dummy region 20 are formed by selectively performing ion implantation from the rear surface side.

The diode depicted in FIG. 10 is manufactured as follows. First, a structure on the front surface side of the diode is formed and after the thinning process of the wafer, ion implantation and annealing of the $n^+$-type cathode region 17, the p-type dummy region 20, the n-type FS region 1 is performed on the rear surface side. Next, lifetime adjustment may be performed by introducing crystal defects in the substrate by an electron beam or injection of heavy metal ions, light element ions such as helium nuclei, and annealing. Next, the rear electrode 7 is formed and dicing is performed, whereby the semiconductor chip 22 is completed.

During ion implantations for forming regions including the $n^+$-type cathode region 17, the p-type dummy region 20, and the n-type FS region 1, evaluation portions for each of the regions are also ion implanted concurrently in a rear-surface PCM region, thereby forming each layer of the rear surface structure of the semiconductor chip 22 and the evaluation portions for layer structures. Analysis of the evaluation portions of the rear-surface PCM 24 facilitates checking the state of a manufacturing process and the quality of each portion of the rear surface structure.

Figure 11:
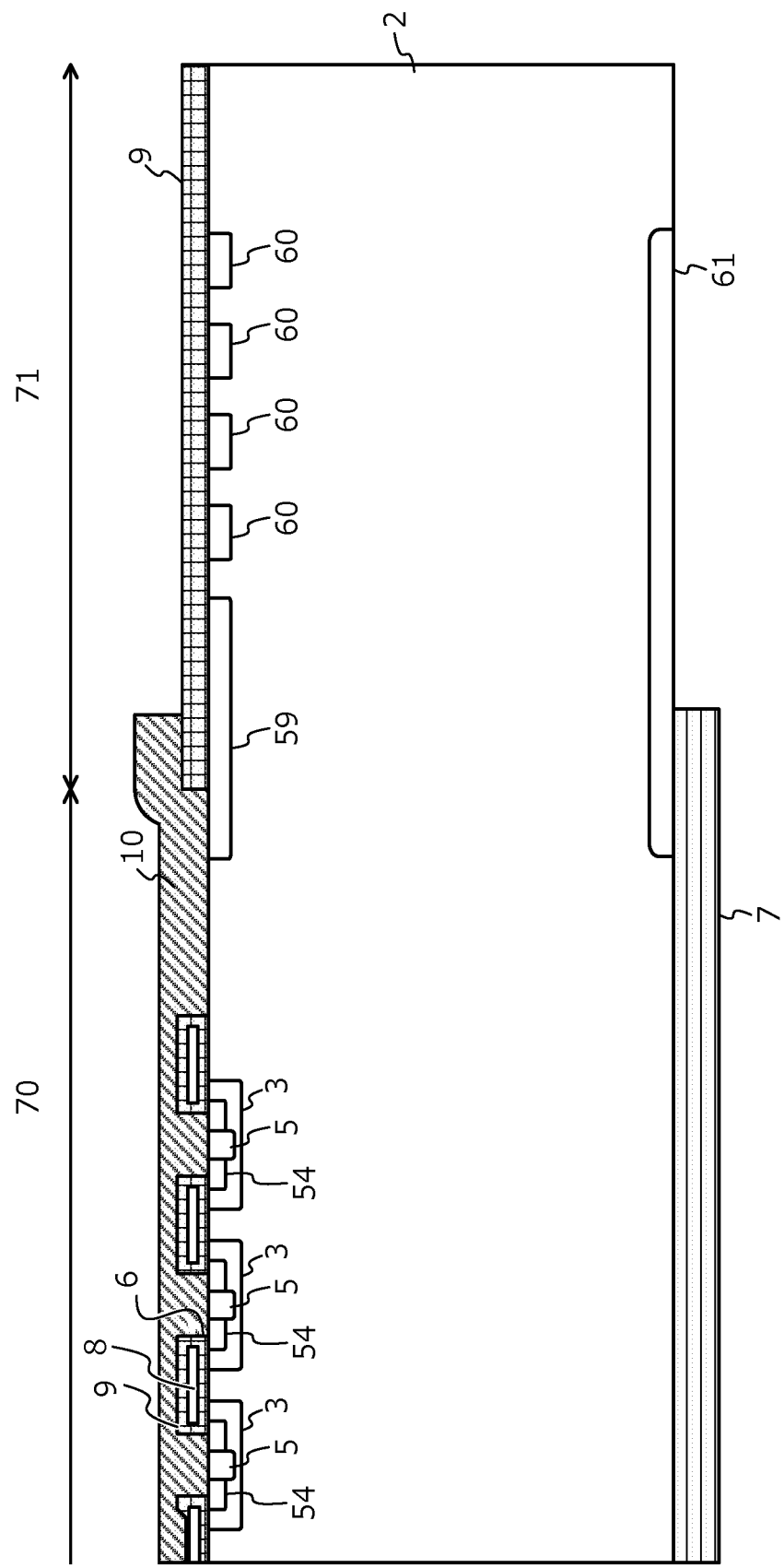
FIG. 11 is a cross-sectional view of the semiconductor device according to a third embodiment.
Figure 12:
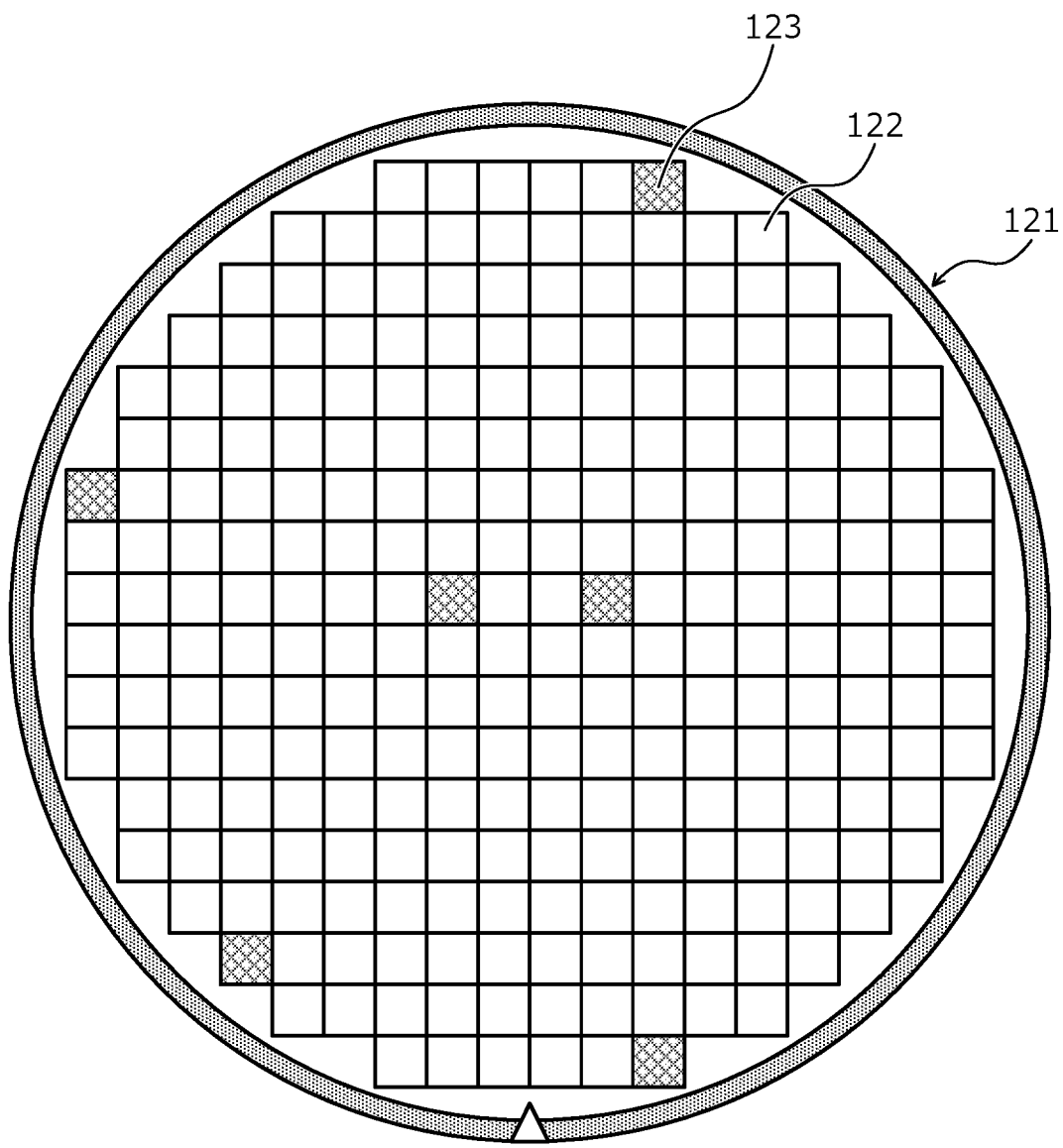
FIG. 12 is a plan view of a front surface of a semiconductor wafer in a method of manufacturing a conventional semiconductor device.
Figure 13:
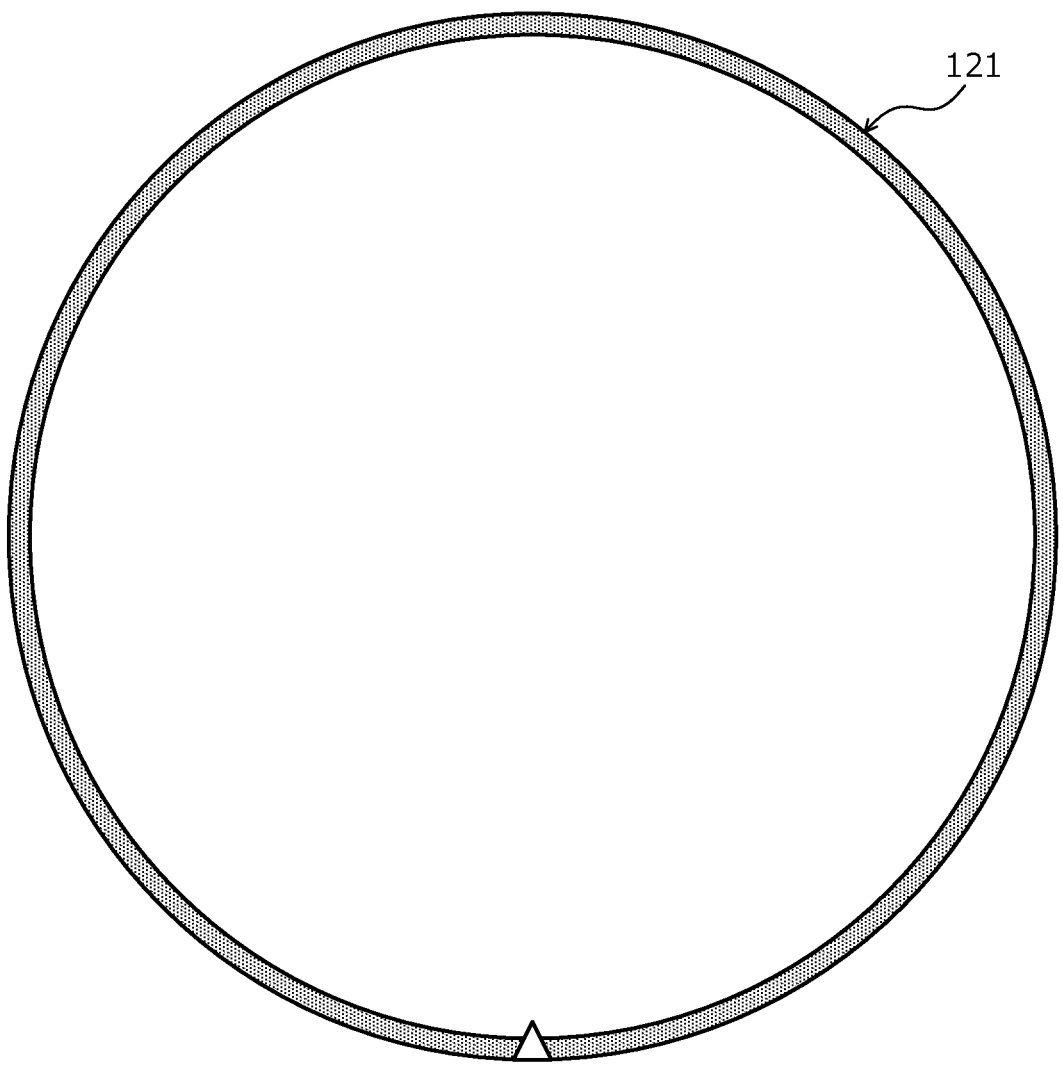
FIG. 13 is a plan view of a rear surface of the semiconductor wafer in the method of manufacturing the conventional semiconductor device.

FIG. 11 is a cross-sectional view of the semiconductor device according to a third embodiment. The semiconductor chip according to the third embodiment is a reverse blocking-metal oxide semiconductor field effect transistor (RB-MOSFET) that includes on the rear surface side, a reverse breakdown voltage structure region. In a general MOSFET, current flows from the rear electrode 7 at the rear surface, to the front electrode 10 at the front surface, through a forward bias junction between the $n^-$-type drift layer 2 and the p-type base region 3, or an n-type inversion channel. However, a RB-MOSFET has a function of stopping the flow of current from the rear electrode 7 to the front electrode 10 by a Schottky junction between the $n^-$-type drift layer 2 and the rear electrode 7. A reverse breakdown voltage structure region 61 of an outer periphery of the rear surface further prevents electric field from being applied to a chip end portion, whereby increases in leak current due to charge generated at the end portion are prevented, thereby maintaining the reverse breakdown voltage.

FIG. 11 is a cross-sectional view of a vicinity of an outer periphery of the RB-MOSFET of the present embodiment. The reverse breakdown voltage structure region 61 of the outer periphery of the rear surface may be a high-resistance region constituted by crystal defects. The high-resistance region is formed by an implantation of an inert ion such as argon (Ar) from the rear surface, or may be a p-type semiconductor region. In this case, the high-resistance region is formed by implantation and activation of a p-type impurity ion, and in SiC, for example, is formed by Al ions. Further, while the reverse breakdown voltage structure region 61 is a RESURF structure region in FIG. 11, a guard ring structure and the RESURF structure may be used.

The RB-MOSFET depicted in FIG. 11 is manufactured as follows. First, a structure (a general MOS structure) of a front surface side of the RB-MOSFET is formed, and after the thinning process, ion implantation for forming the reverse breakdown voltage structure region 61 and suitable annealing are performed. Thereafter, a drain electrode constituting a Schottky junction is formed at the rear surface and dicing is performed, whereby the semiconductor chips are completed.

In an active region portion 70 of a front surface structure, the p-type base region 3, the $p^+$-type contact region 5, and an $n^+$-type source region 54 are provided on a front surface side of the $n^-$-type drift layer 2. Further, the gate electrode 8 is provided at the front surface of the $n^-$-type drift layer 2, via the gate insulating film 6. Further, the interlayer insulating film 9 is provided so as to cover the gate electrode 8, contact holes are selectively provided in the interlayer insulating film 9, and the front electrode 10 (source electrode) is provided. Further, a RESURF region 59 and a guard ring region 60 are provided in a termination region 71 and are covered by the interlayer insulating film 9.

In the active region portion 70 of a rear surface structure, the rear electrode 7 is provided. Further, in the termination region 71, the reverse breakdown voltage structure region 61 is provided.

During ion implantation for forming the reverse breakdown voltage structure region 61 of a rear-surface outer peripheral portion, evaluation portions for regions are concurrently ion implanted in the rear-surface PCM region, whereby layers of the rear surface structure of the semiconductor chip 22 and the evaluation portions for layer structures are formed. Annealing may be performed similarly to that for the semiconductor chips. Analysis of the rear-surface PCM 24 facilitates inspection of manufacturing processes for forming the reverse breakdown voltage structure region 61 of the rear surface side.

In the foregoing, various modifications within a range not departing from the spirit of the present invention are possible. In the described embodiments, for example, dimensions, impurity concentrations, etc. of regions may be variously set according to required specifications.

For example, in the first embodiment, described ion/particle beam irradiations and annealing of the rear surface side may be performed in a different sequence. To prevent defects from occurring during ion/particle beam irradiation and annealing of the rear surface side, a suitable protective film suffices to be formed and removed on the front surface side.

In the third embodiment, while description is given with respect to a RB-MOSFET, the semiconductor device may be an RB-IGBT that includes a collector layer at the rear surface. In the first embodiment and the third embodiment, while description is given with respect to a transistor that includes a MOS gate on a surface side, application may be with respect to a diode that does not have a control electrode or source as in the second embodiment. Further, application may be with respect to a thyristor.

In the first embodiment, while description is given with respect to a RC-IGBT, application may be with respect to an impurity layer of the rear surface of a transistor without a FWD function. Further, application may be with respect to cases where a structure is not uniform in a region of the rear surface. For example, by providing monitor regions for ion implantations for forming regions of differing concentrations, application may be with respect to an IGBT in which the concentration of the collector layer has a predetermined distribution and hole injection has a predetermined distribution.

In the third embodiment, while description is given with respect to application to a reverse breakdown voltage structure, application may be with respect to a vicinity of an outer periphery of the rear surface of a device without reverse breakdown voltage. For example, application may be with respect to a case in which various characteristics are to be improved by changing configurations of the FS region at a region substantially opposing a front-surface edge termination structure portion, an impurity layer of a rearmost surface or a nearest vicinity thereof, the lifetime adjusting layer, the active region, and/or a center portion of the chip.

Further, regarding the method of manufacturing the semiconductor device according to the embodiments, while description has been given taking a RC-IGBT, a diode, and a RB-MOSFET as examples, the present invention is applicable to vertical semiconductor devices, is particularly suitable for vertical semiconductor devices in which an element structure is formed on the rear surface side, and is further suitable for vertical semiconductor devices in which plural element structures are formed on the rear surface side. Further, to enhance and improve characteristics, application is further possible with respect to a vertical semiconductor device in which impurity defects that become lifetime killers are introduced in the n$^-$-type drift layer 2 from the rear surface side. Moreover, the method of manufacturing according to the present invention is not limited to use of Si or SiC as a wafer material and is further applicable to other materials such as GaN. In the method of manufacturing according to the present invention, while an evaluation portion where ion implantation is performed is described as an example of the rear-surface PCM, an evaluation portion may be for an insulating film, the rear electrode, or the like.

As described, according to the present invention, the rear-surface PCM is formed at the rear surface of the semiconductor wafer. As a result, by analyzing the rear-surface PCM, it becomes possible to analyze a manufacturing process of a semiconductor region that is formed from the rear surface side of the semiconductor wafer. Further, a PCM is formed at the front surface as well, and the rear-surface PCM and the PCM of the front surface may be provided at the same position in the semiconductor wafer, on a first main surface side and a second main surface side, respectively. With such configuration, there are fewer regions where no commercial product (the semiconductor chip) is formed.

The method of manufacturing a semiconductor device according to the embodiments of the present invention achieve an effect in that a cause of a defect may be identified at a manufacturing process of a region formed from the rear surface of the semiconductor wafer.

As described, the method of manufacturing a semiconductor device according to the present invention is useful for high-voltage semiconductor devices used in power converting equipment and in power supply devices such in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device from a semiconductor wafer in which a plurality of semiconductor chips are formed, the method comprising:

laying out a plurality of chip areas for the semiconductor chips in the semiconductor wafer, the semiconductor wafer having a first main surface and a second main surface opposite to the first main surface;

forming a plurality of active regions in the plurality of chip areas, respectively;

forming at the second main surface a first process control monitor (PCM) in a first area other than the chip areas in which the active regions are formed; and concurrently performing an ion implantation by implanting ions at the first area to form the first PCM and at each of the chip areas of the second main surface of the semiconductor wafer respectively to form a corresponding one of the active regions.

2. The method according to claim 1, further comprising before forming the first PCM, forming at the first main surface of the semiconductor wafer a second PCM in a second area other than the chip areas in which the active regions are formed, wherein the first area and the second area entirely overlap each other in a plan view of the semiconductor wafer.

3. The method according to claim 1, wherein forming a plurality of active regions includes performing a plurality of ion implantations in the plurality of active regions at the second main surface, and only one of the plurality of ion implantations performed in the active regions at the second main surface is concurrently performed at the first area to form the evaluation portion.

4. The method according to claim 1, wherein
forming the plurality of active regions includes performing a plurality of ion implantations in the plurality of active regions at the second main surface, and
a combination of more than one ion implantation among the plurality of ion implantations performed in the active regions at the second main surface is concurrently performed at the first area to form the evaluation portion.

5. The method according to claim 1, wherein forming the first PCM includes forming a marker at the first area for identifying a position of the first PCM relative to an entire area of the second main surface of the semiconductor wafer.

6. The method according to claim 1, wherein
the first PCM includes a plurality of marker portions, and
forming the first PCM includes forming a first marker portion disposed, as viewed in a plan view of the semiconductor wafer, at a center position of the second main surface of the semiconductor wafer, and a second marker portion disposed, as viewed in a plan view of the semiconductor wafer, at a peripheral position of the second main surface of the semiconductor wafer.

7. The method according to claim 1, wherein
forming a plurality of active regions includes forming a first load electrode on the first main surface, and a second load electrode on the second main surface so that a current passes between the first load electrode and the second load electrode.

8. The method according to claim 7, wherein
forming a plurality of active regions includes forming at the first main surface a control electrode that controls the current passing between the first load electrode and the second load electrode.

9. A method of manufacturing a semiconductor device from a semiconductor wafer in which a plurality of semiconductor chips are formed, the method comprising:
laying out a plurality of chip areas for the semiconductor chips in the semiconductor wafer, the semiconductor wafer having a first main surface and a second main surface opposite to the first main surface;
performing at the first main surface of the semiconductor wafer, a plurality of forming steps for forming a plurality of first active regions in the chip areas;
forming at the first main surface of the semiconductor wafer, a process control monitor (PCM) in a second area other than the chip areas in which the first active regions are to be formed;
performing at the second main surface of the semiconductor wafer, a plurality of forming steps for forming a plurality of second active regions in the chip areas;
forming at the second main surface an other PCM in a first area other than the chip areas in which the second active regions are formed; and
concurrently performing an ion implantation by implanting ions at the first area to form the first PCM and at each of the chip areas of the second main surface of the semiconductor wafer respectively to form a corresponding one of the active regions.

10. A method of manufacturing a semiconductor device from a semiconductor wafer in which a plurality of semiconductor chips are formed, the method comprising:
laying out a plurality of chip areas for the semiconductor chips in the semiconductor wafer, the semiconductor wafer having a first main surface and a second main surface opposite to the first main surface;
forming a plurality of active regions respectively in corresponding ones of the plurality of chip areas; and
forming at the second main surface a first process control monitor (PCM) in a first area other than the chip areas in which the active regions are formed, wherein
the first PCM includes a plurality of marker portions, and
forming the first PCM includes forming a first marker portion disposed, as viewed in a plan view of the semiconductor wafer, at a center position of the second main surface of the semiconductor wafer, and a second marker portion disposed, as viewed in a plan view of the semiconductor wafer, at a peripheral position of the second main surface of the semiconductor wafer.

* * * * *